(12) United States Patent
Barabi (10) Patent No.: US 6,297,654 B1
(45) Date of Patent: Oct. 2, 2001

(54) TEST SOCKET AND METHOD FOR TESTING AN IC DEVICE IN A DEAD BUG ORIENTATION

(75) Inventor: Nasser Barabi, Lafayette, CA (US)

(73) Assignee: Cerprobe Corporation, Hayward, CA (US)

( * ) Notice: Subject to any disclaimer, the term of this patent is extended or adjusted under 35 U.S.C. 154(b) by 0 days.

(21) Appl. No.: 09/602,924

(22) Filed: Jun. 22, 2000

Related U.S. Application Data

(60) Provisional application No. 60/144,059, filed on Jul. 14, 1999.

(51) Int. Cl.[7] .............................. G01R 31/02; H01R 13/15
(52) U.S. Cl. .............................................. 324/755; 439/264
(58) Field of Search ................................. 324/752, 755; 439/264, 266

(56) References Cited

U.S. PATENT DOCUMENTS

| | | |
|---|---|---|
| 4,089,575 | 5/1978 | Grabbe . |
| 4,351,580 | 10/1982 | Kirkman et al. . |
| 4,583,806 | 4/1986 | Tainter, Jr. et al. . |
| 4,747,784 | 5/1988 | Cedrone . |
| 4,789,345 | 12/1988 | Carter . |
| 5,086,269 | 2/1992 | Nobi . |
| 5,387,120 | 2/1995 | Marks et al. . |
| 5,395,254 | 3/1995 | Mogi . |
| 5,518,410 | 5/1996 | Masami . |
| 5,791,914 | 8/1998 | Laranger et al. . |
| 5,793,618 | 8/1998 | Chan et al. . |
| 5,926,027 | 7/1999 | Bumb, Jr. et al. . |
| 5,997,316 | 12/1999 | Kunzel . |
| 6,018,248 | 1/2000 | Kelsey et al. . |
| 6,127,833 | 10/2000 | Wu et al. . |

*Primary Examiner*—Safet Metjahic
*Assistant Examiner*—James Kerveros
(74) *Attorney, Agent, or Firm*—Donald L. Beeson (57) ABSTRACT

A test socket for testing an optical IC device in a dead bug orientation includes a socket body with a device under test cavity (DUT cavity) for receiving an optical IC device under test (optical DUT) in a contact-up or dead bug orientation. The DUT cavity has a bottom wall with at least one aperture through which the photoactive side of the optical DUT held in the cavity can be illuminated. An outer array of axial contact elements arranged about the DUT cavity provides conductive paths through the socket body. The test socket further includes a plunger assembly insertable into the DUT cavity of the socket body having an inner array of axial contact elements which extend through the plunger assembly and which are configured to provide contact with the contacts on the contact side of the optical DUT. A transverse conductor bridge at the top of the plunger assembly provides a transverse electrical path connecting the inner array of axial contact elements of the plunger assembly and the outer array of axial contact elements of the socket body when the plunger assembly is inserted into the DUT cavity. An electrical path is thereby provided between the contacts of the contact optical DUT and the bottom of the socket body mounted to the DUT board through the plunger assembly and socket body.

24 Claims, 6 Drawing Sheets

TEST SOCKET AND METHOD FOR TESTING AN IC DEVICE IN A DEAD BUG ORIENTATION

CROSS-REFERENCE TO RELATED APPLICATIONS

This applications claims the benefit of U.S. Provisional Application No. 60/144,059, filed Jul. 14, 1999.

BACKGROUND OF THE INVENTION

The present invention generally relates to the testing of integrated circuit (IC) devices, and has particular application to the testing of optical IC devices where the IC must be illuminated by a light source to produce a detectable electrical response for test.

The testing of IC devices is typically accomplished using IC test sockets which hold a device under test ("DUT") to a test board (often referred to as a "DUT board") with the electrical contacts of the IC facing the DUT board. This orientation of the DUT is known as a "live bug" orientation referring to its resemblance to a live bug with its feet on the ground. While conventional IC socket designs are well adapted to the testing in a live bug orientation, a need exists for an IC socket which can accomplish a test of an IC in a "dead bug" orientation where the IC leads are reversed in the test cavity, that is, where the IC is on its back with its contacts facing up away from the DUT board. One class of IC devices that are best suited for testing in a dead bug orientation are optical IC devices having photoactive circuitry that must be illuminated to produce an electrical signal capable of being processed. Such optical ICs are used in a variety of applications ranging from optical sensors to digital cameras. When testing such ICs ("optical DUTs") the photoactive circuitry of the optical DUT must be illuminated to produce a test result. Where automated pick and place machinery is used to load the test socket, an optical DUT cannot be easily illuminated since the photoactive circuitry is on the side of the DUT which is picked up by the pick and place arm of the automated handling equipment. Illumination from the side of the DUT would require a costly mechanism for doing so built into the automated handler.

The present invention provides a test socket and mechanism for efficiently testing a DUT in a dead bug orientation, and particularly for testing the optical DUT in a manner that facilitates illumination of the photoactive circuitry of the optical DUT during test. In accordance with the invention, the optical DUT can be illuminated from the light source below the DUT board, thereby allowing illumination of the DUT from below the DUT board without costly design modifications to the automated handler machinery.

SUMMARY OF THE INVENTION

In accordance with the invention, a test socket is provided for testing any IC device in a dead bug orientation and particularly an optical IC device having a photoactive side and a plurality of electrical contacts on an opposite facing contact side of the device. The test socket has a socket body having a top, a bottom for mounting to a test board, and a DUT cavity extending downwardly from the top of the socket body for receiving an optical DUT in a contact-up orientation. In the socket for an optical DUT, the bottom wall of the DUT cavity has at least one aperture through which the photoactive side of an optical DUT in a contact-up orientation can be illuminated. The test socket is further comprised of a plunger assembly which includes a top end, a plunger end insertable into the DUT cavity of the socket body, and an inner array of axial contact elements which extend through the plunger assembly. The inner array of axial contact elements are configured to make contact with the electrical contacts on the upper contact side of the optical DUT when the optical DUT, in its dead bug orientation, is contacted by the assembly's plunger end. In addition to the inner array of contact elements in the plunger assembly, an outer array of axially oriented contact elements is arranged about the DUT cavity for providing an electrical path through the socket body. A transverse conductor bridge at the top of the plunger assembly provides a transverse electrical path that spans the inner and outer contact elements of the plunger assembly and socket body elements. This conductor bridge electrically connects the inner and outer contact elements when the plunger assembly is fully inserted into the DUT cavity.

In accordance with the preferred embodiments of the invention, the inner and outer array of axial contact elements are provided in the form of low-profile, double-ended spring contact pins, sometimes referred to as "pogo pins," while the transverse conductor bridge is provided in the form of a printed circuit board having conductor traces that extend from an inner end contacted by the inner array of axial contact elements of the plunger assembly to an outer end contacted by the array of axial contact elements of the socket body. Such a configuration provides a low-profile arrangement of conductors resulting in a low-profile test socket.

The invention also provides for a method of testing an optical IC device comprised of providing a test socket which includes a socket body having a DUT cavity and an aperture in the bottom wall of the DUT cavity. In accordance with the method, the optical DUT is placed in a contact-up orientation in the DUT cavity so that the photoactive side of the optical DUT is exposed through the DUT cavity aperture. The optical DUT is held in the DUT cavity by a plunger assembly having an array of contact elements configured to provide contact with the electrical contacts on the face-up contact side of the optical DUT. The contact elements of the plunger assembly are electrically interconnected by a conductor bridge to outer contact elements in the socket body of the test socket for providing an electrical path to the test board to which the test socket is mounted. The method can also be applied to test IC devices in a dead bug orientation other than optical DUTs.

Therefore, it can be seen that it is a primary object of the invention to provide a test socket and method for testing IC device in a dead bug orientation. It is another object of the invention to provide a test socket and method for efficiently testing an optical DUT. It is still a further object of the invention to reduce the cost of automated testing of optical DUTs. Still further objects of the invention will be apparent from the following specification and claims.

DETAILED DESCRIPTION OF THE ILLUSTRATED EMBODIMENT

Figure 1:
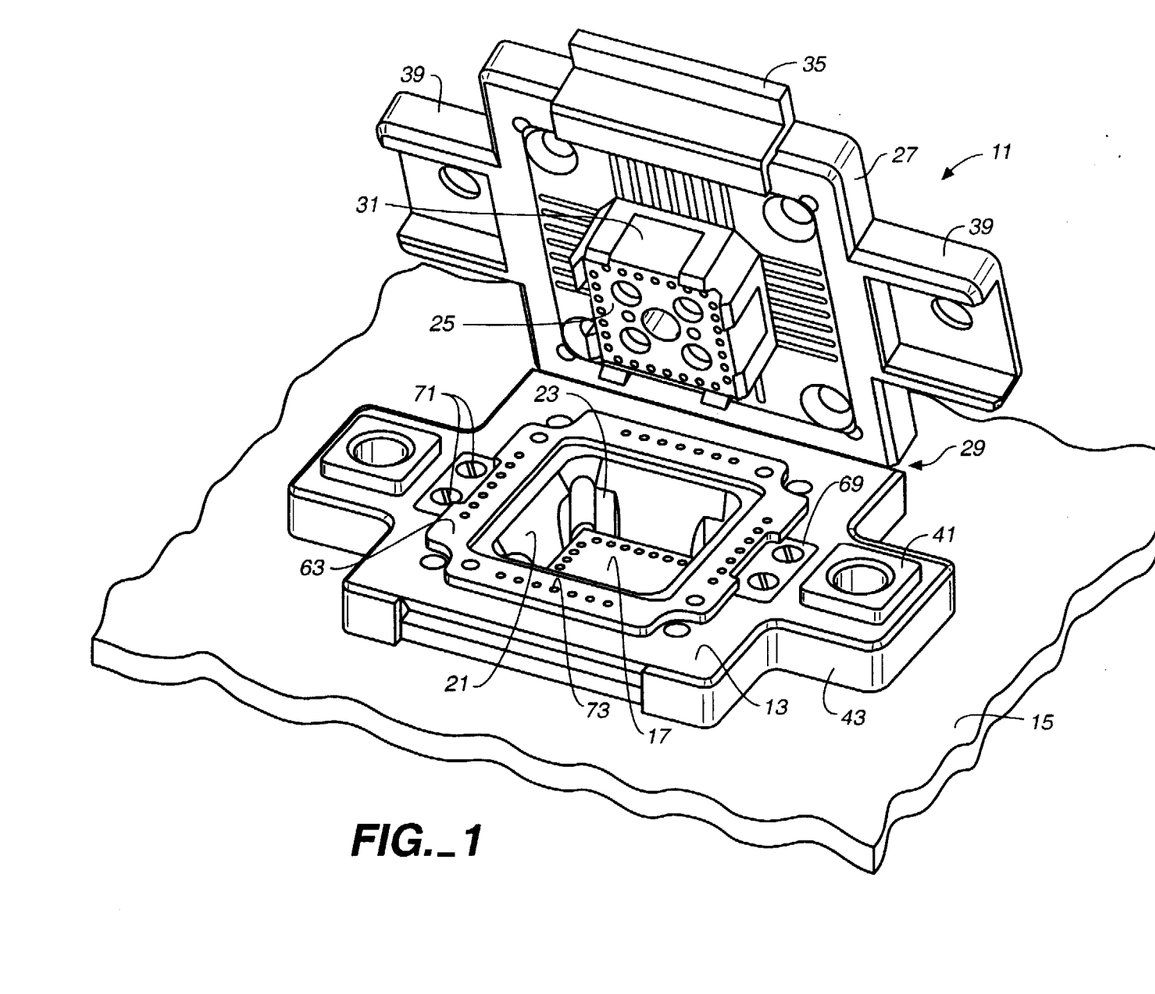
FIG. 1 is a top perspective view of an optical DUT test socket mounted to a test board.
Figure 2:
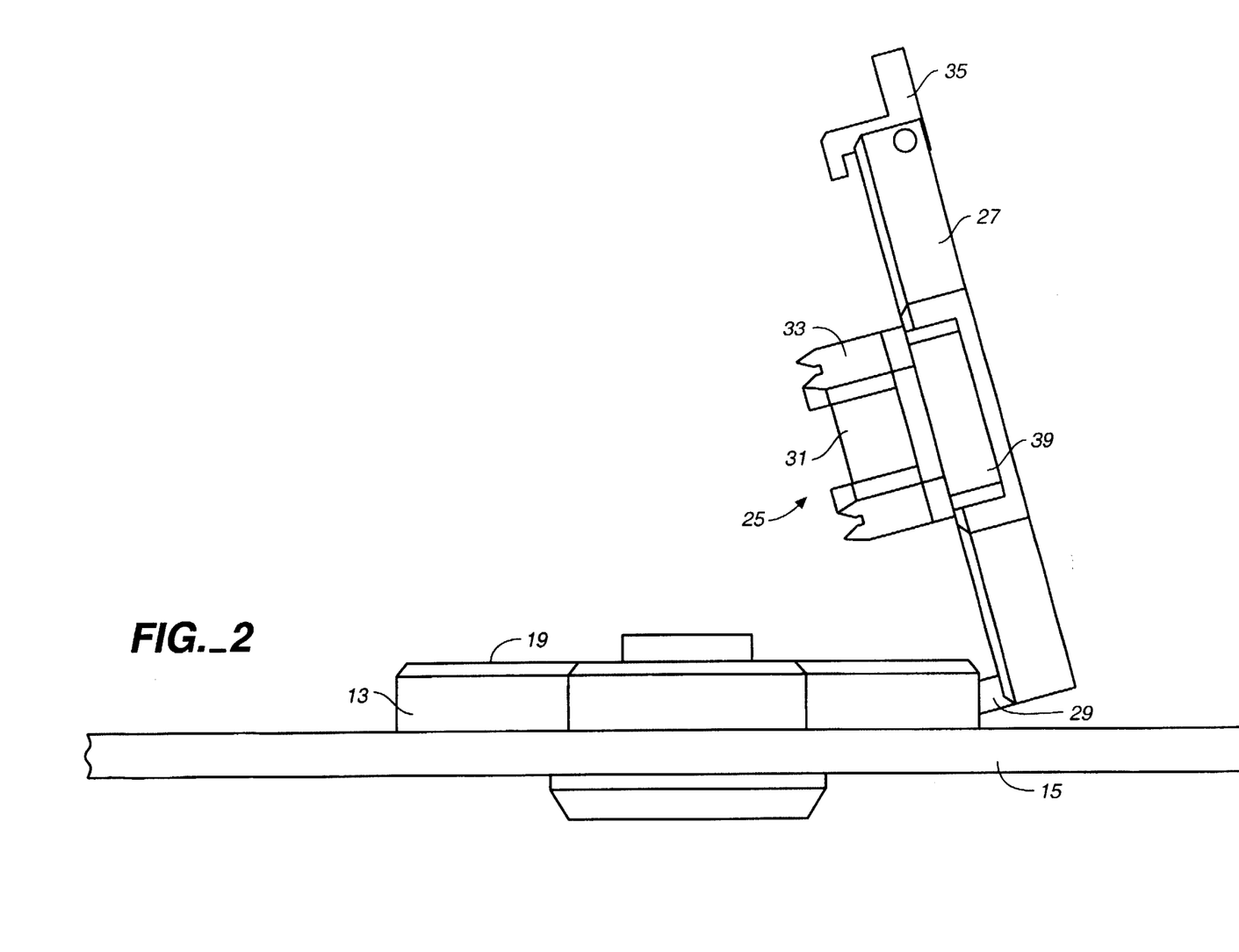
FIG. 2 is a side elevational view thereof.

Referring now to the figures, FIGS. 1 and 2 show a test socket 11 having a socket body 13 mounted to a planar test board through which the test socket is electrically connected to a test machine (not shown). A generally square-shaped DUT cavity 17 extends downwardly into socket body 13 for receiving an optical DUT in a contact-up orientation as hereinafter described. The DUT cavity includes inwardly tapered side walls 21 and straight corner guide surfaces 23 to facilitate the insertion of the DUT into the cavity.

An optical DUT is inserted into the DUT cavity by means of plunger assembly 25 fastened to lid structure 27 which is hinged at 29 to one edge of the socket body. The plunger assembly is seen to include side walls 31, having an inward taper that corresponds to the inwardly tapered side walls 21 of the DUT cavity. Similarly, the corner structures 33 of the plunger assembly are constructed with straight, non-tapered surfaces to slide within the DUT cavity's corner guide surfaces 23 when the lid structure 27 is closed.

In operation, the plunger end 26 of plunger assembly 25 contacts the contact side of an optical DUT and holds it in the bottom of the DUT cavity when the lid structure of the socket is closed.

The test socket is adapted to both manual use and automated testing process using conventional pick and place machines. For manual use, the lid structure is hinged to the socket body as above described, such that the plunger assembly extends into the DUT cavity as the lid structure is closed. In such manual operation, the lid structure is releasably locked in its operatively closed position by means of a latch handle 35 which, as shown in FIG. 3, can be removably secured to the edge of the latch handle opposite hinge 29 by means of latch pins 37.

For auto testing using pick and place machinery, the lid structure can be detached from the socket body at its hinge point 29 and the latch handle 35 removed. The lid structure can be secured to the moving arm of the automated testing machinery by means of channel-shaped extension arms 39 which fit over the alignment bushings 41 of extensions 43 on the socket body as more fully described below.

Figure 3:
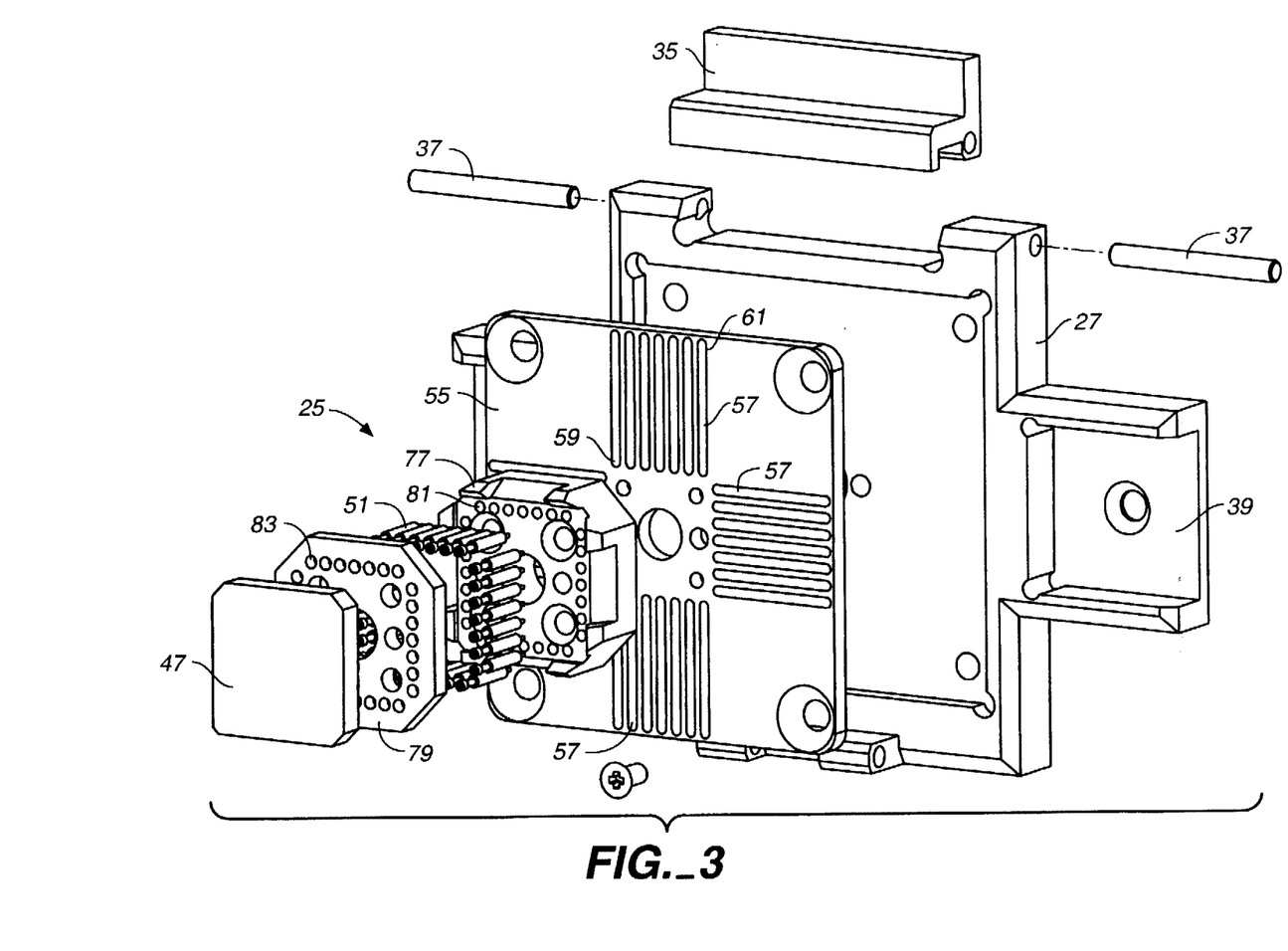
FIG. 3 is an exploded bottom perspective view of a plunger unit for the test socket of FIGS. 1 and 2 comprised of a plunger assembly, PC board bridge, and lid structure.
Figure 4:
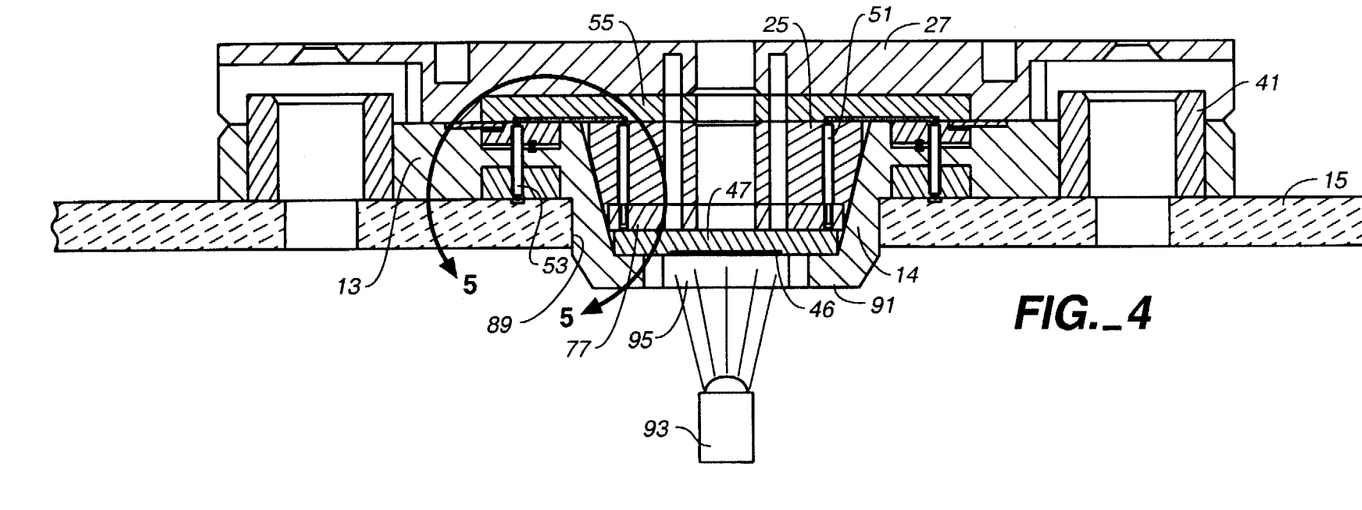
FIG. 4 is a cross-sectional view in side elevation of the test socket shown in FIGS. 1 and 2, with the lid of the plunger unit closed.
Figure 5:
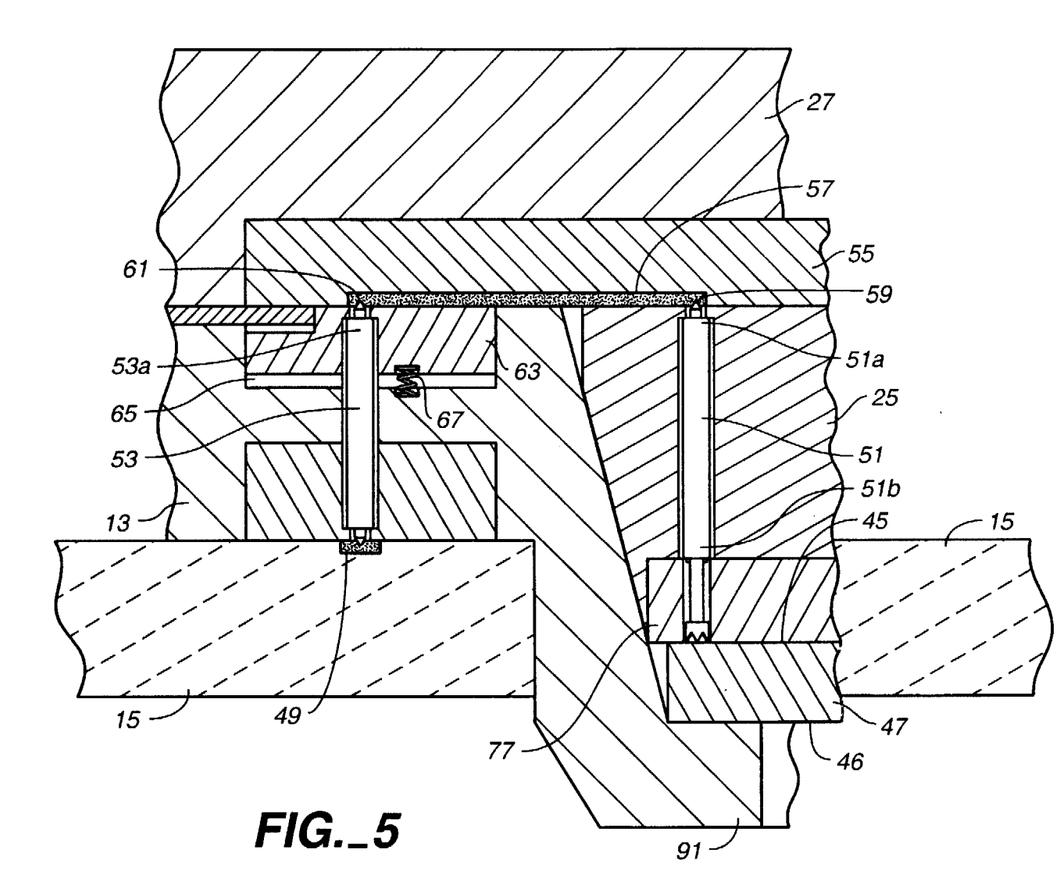
FIG. 5 is an enlarged cut-away view of a portion of the test socket shown by section lines 5—5 in FIG. 4.

Referring to FIGS. 3–5, conductive paths between the electrical contacts on the top side 45 of optical DUT 47 and the conductor pads 49 on test board 15 are provided by conductor elements which include an inner array of axial spring pins 51 held in plunger assembly 25 and, as shown in FIGS. 4 and 5, an outer array of axial spring elements 53 held in the socket body 13. To correspond with a typical arrangement of contacts on an optical DUT, the inner array of spring pins is shown to be distributed in a ring around the four sides of the outer periphery of the plunger assembly. The outer array of spring pins in the socket body are, in turn, arranged in rows adjacent each of the four lateral edges of the DUT cavity to form an outer ring of spring pins which are in opposition to the inner ring of spring pins of the plunger assembly. A conductive path is provided between the inner and outer ring of spring pins 51, 53 by means of a transverse conductor bridge in the form of PC board 55 that includes four sets of radially extending conductor traces 57 having inner contact ends 59 which align with the inner spring pins of the plunger assembly and outer contact ends 61 which align with the outer spring pins of the socket body. As best shown in FIG. 5, the conductor traces 57 of PC board 55 span the two rings of spring pins and cause an electrical path between the spring pins to be established when the plunger unit comprised of the plunger assembly 25, PC board 55 and lid structure 27, is closed over socket body 13. It is further noted that a protective ring plate 63 surrounding DUT cavity 17 covers the outer spring pins 53 to protect these pins when the lid structure 27 is closed. As shown in FIG. 5, ring plate 63 is depressably supported in an annular recess 65 in the top 19 of the socket base by a suitable number of compression springs 67 dispersed around the bottom of the recess. The ring plate is depressably held in this recess by hold-down plates 69 fastened to the socket body by means of screw fasteners 71. A series of holes are provided along each side of the ring plate to accommodate the top end 53a of the outer spring pins while the ring plate's underside is suitably counterbored to accommodate the spring pin's outer barrel and to retain the top end of the spring pins in their axial alignment.

Figure 3A:
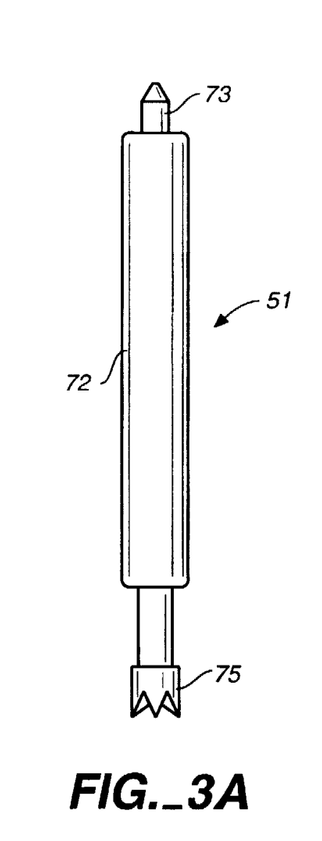
FIG. 3A is an enlarged side elevational view of one of the spring pins in the plunger assembly shown in FIG. 3.

FIGS. 3, 3A and 5 best illustrate the manner in which the inner ring of spring pins 51 are retained within plunger assembly 25. Specifically, inner spring pins 51 having an outer barrel portion 72, and upper and lower tips 73, 75 are held in the base 77 of the plunger assembly by means of a plunger cap 79 that fastens to base 77 at the plunger end of the assembly by suitable fasteners (not shown). A ring of pin openings 81, 83 are provided in the base 77 and cap 79 to accommodate the inner ring of pins. These openings are suitably sized to allow the tips 73, 75 to project from the top and bottom ends of the plunger assembly while retaining the barrel of the spring pins within the plunger base structure.

It will be appreciated that other constructions are possible for retaining the inner ring of spring pins 51 within the plunger assembly, for example, the cap 79, rather than being provided on the plunger end of the assembly, can instead be located at the other end of the base. These and other constructional details of the socket can be varied depending on application and manufacturing requirements.

In a manual test mode, the lid structure 27 of test socket 11 is, as above described, hinged to the socket base 13, which in turn is fastened to test board 15 by suitable fasteners (not shown). To perform a manual test, the optical DUT is placed in a dead bug orientation in the DUT cavity 17, and the lid structure closed over the socket base. Referring to FIG. 4, it can be seen that when the lid structure is closed, the plunger assembly 25 is fully inserted into the DUT cavity such that the plunger end of the assembly contacts and holds the optical DUT in the bottom of the cavity against the cavity's bottom wall 91 to produce and maintain electrical contact between the DUT's electrical contacts (not shown) and the inner ring of spring pins 51. It is further seen that the DUT cavity is formed in a center portion 14 of the socket body, which projects through a corresponding opening 89 in the test board 15 so as to place the optical DUT 47 at roughly the same level as the test board. At this level, the optical DUT's photoactive surface 46 is exposed to a light source, such as light source 93, through bottom wall aperture 95. Upon illumination by light source 93, a test response from the optical DUT is generated which is transmitted to the DUT board 15 through the inner and outer spring pins 51, 53 and transverse PC board 55 as above described.

Figure 6:
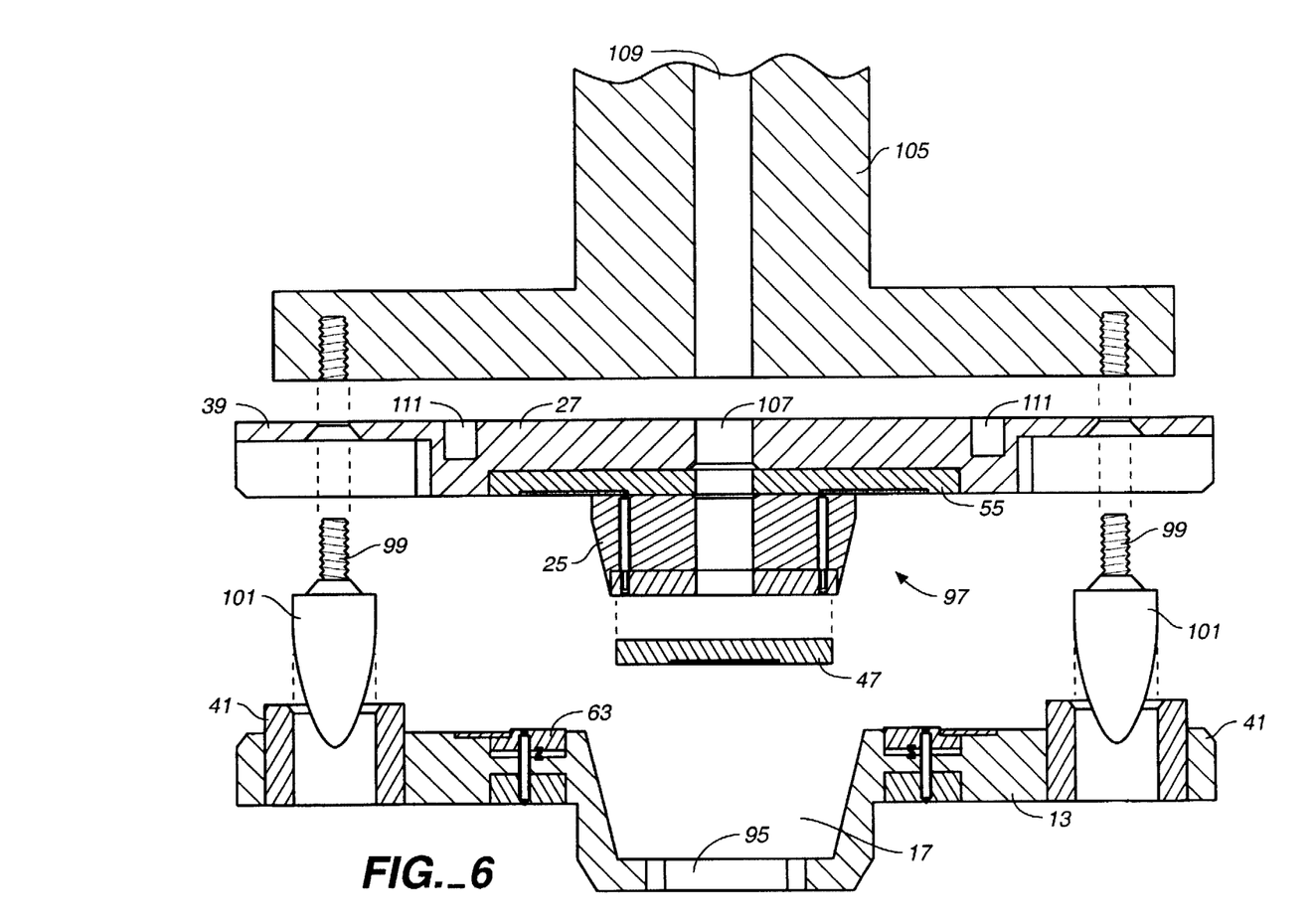
FIG. 6 is an exploded partial view of a plunger unit of a test socket in accordance with the invention showing the use of the test socket with the robotic arm of an automated test machine.

FIG. 6 illustrates one way in which the test socket of the invention can be used in an auto test mode. In FIG. 6, the lid structure 27 is detached from the socket base to provide a separate plunger unit 97 formed by the plunger assembly 25, PC board 55, and lid structure 27. This plunger unit is fastened by the threaded ends 99 of bullet-shaped alignment pins 101 to the operative end 103 of a robotic arm 105. An air passageway 107 extends through the center of the assembled parts of the plunger unit 97 to communicate with air passageway 109 in a robotic arm to permit vacuum pickup of the optical DUT 47 prior to placement of the plunger unit onto the socket body. As the robotic arm 105 moves to engage the plunger unit 97 in the DUT cavity of the socket body, the alignment posts 101 on the underside of the plunger unit's lid structure will engage the socket body's alignment bushings 41 to produce and maintain proper alignment of parts while the plunger unit is engaged. It is noted that suitable key holes 111 can additionally be provided in the top of lid structure 27 to accommodate alignment pins (not shown) on the robotic arm.

It will be understood that other auto test configurations are possible using the test socket of the invention. For example, a plunger unit which is simply comprised of plunger assembly 25 and PC board 55 can be attached directly to a robotic arm without using the lid structure 27.

Finally, it can be seen that the test socket of the present invention, whether used in a manual mode or with automated pick and place machinery, provides a method of testing any IC device in a dead bug orientation by providing a conductive paths (in the form of spring pins 51, 53) to the DUT board 15 back through the test socket's plunger assembly 25 and socket body 13. These circuit paths are closed when the plunger assembly is inserted into the socket's DUT cavity by conductively bridging the paths in the plunger assembly and socket body by means of the PC board 55. Such a method permits an optical DUT 47 to be tested by illuminating the DUT using a light source 93 positioned below the DUT board as shown in FIG. 4 and described above.

While the present invention has been described in considerable detail in the foregoing specification, it is understood that it is not intended that the invention be limited to such detail except as necessitated by the following claims.

What we claim is:

1. A test socket for testing an IC device having a contact side and plurality of electrical contacts on its contact side, said test socket comprising:

a socket body having a top, a bottom for mounting to a test board, and a device under test cavity (DUT cavity) extending downwardly from the top of the socket body for receiving an IC device under test (DUT) in a contact-up orientation, said DUT cavity having a bottom wall and an outer array of axial contact elements about said DUT cavity which provide electrical paths from the top to the bottom of the socket body;

a plunger assembly having a top end, a plunger end insertable into the DUT cavity of said socket body and an inner array of axial contact elements extending through the plunger assembly, said inner array of axial contact elements being configured to provide contact with the plurality of contacts on the contact side of a DUT when contacted in a contact-up orientation by the plunger end of the plunger assembly; and a transverse conductor bridge at the top end of said plunger assembly for providing a transverse electrical path connecting the inner array of axial contact elements of said plunger assembly and the outer array of axial contact elements of said socket body when the plunger assembly is inserted into the DUT cavity such that, when the plunger assembly is inserted in the DUT cavity, an electrical path is provided between the contacts of the contact-up DUT at the plunger end of the plunger assembly and the bottom of the socket body of the test socket.

2. The test socket of claim 1 wherein said inner and outer array of axial contact elements are low-profile double-ended spring contact pins.

3. The test socket of claim 1 wherein said transverse conductor bridge is comprised of a transverse printed circuit (PC) board having conductor traces radially extending from inner ends which are contacted by the inner array of contact elements of said plunger assembly to outer ends which are contacted by the outer array of contact elements of said socket body.

4. The test socket of claim 3 wherein said transverse printed circuit board is removably attached to the top of the plunger assembly to provide a plunger unit capable of being operatively manipulated over the socket body either manually or by automated machinery.

5. The test socket of claim 4 wherein at least one air passageway extends through the plunger unit comprised of said PC board and center plunger assembly to permit vacuum pick-up of the DUT.

6. The test socket of claim 1 further comprising a lid structure for closing over the top of said socket body when the plunger assembly along with a contact-up DUT is inserted into the DUT cavity and for holding the DUT, the inner array of contact elements of said plunger assembly, the transverse conductor bridge, and the outer array of conductor elements of said socket body in electrical contact with each other.

7. The test socket of claim 6 wherein the transverse conductor bridge and the plunger assembly are removably mounted to the underside of said lid to form a plunger unit capable of being operatively manipulated over the socket body either manually or by automated machinery.

8. The test socket of claim 7 wherein said lid structure is detachably hinged to the socket body of the test socket for manual operation of the plunger unit comprised of the lid, transverse conductor bridge, and plunger assembly.

9. The test socket of claim 7 wherein at least one air passageway extends through the plunger unit comprised of the lid structure, transverse conductor bridge and plunger assembly to permit vacuum pick-up of the DUT.

10. A test socket for testing an optical IC device having a photoactive side and a plurality of electrical contacts on an oppositely facing contact side, said test socket comprising:

a socket body having a top, a bottom for mounting to a test board, and a device under test cavity (DUT cavity) extending downwardly from the top of the socket body for receiving an optical IC device under test (optical DUT) in a contact-up orientation, said DUT cavity having a bottom wall and at least one aperture in said bottom wall through which the photoactive side of an optical DUT when held in the DUT cavity in a contact-up orientation can be illuminated, said socket body further having an outer array of axial contact elements about said DUT cavity which provide electrical paths from the top to the bottom of the socket body;

a plunger assembly having a top end, a plunger end insertable into the DUT cavity of said socket body and an inner array of axial contact elements extending through the plunger assembly, said inner array of axial contact elements being configured to provide contact with the plurality of contacts on the contact side of an optical DUT when contacted in a contact-up orientation by the plunger end of the plunger assembly; and a transverse conductor bridge at the top end of said plunger assembly for providing a transverse electrical path connecting the inner array of axial contact elements of said plunger assembly and the outer array of axial contact elements of said socket body when the plunger assembly is inserted into the DUT cavity such that, when the plunger assembly is inserted in the DUT cavity, an electrical path is provided between the contacts of the contact-up optical DUT at the plunger end of the plunger assembly and the bottom of the socket body of the test socket.

11. The test socket of claim 10 wherein said inner and outer array of axial contact elements are low-profile double-ended spring contact pins.

12. The test socket of claim 10 wherein said transverse conductor bridge is comprised of a transverse printed circuit (PC) board having conductor traces radially extending from inner ends which are contacted by the inner array of contact elements of said plunger assembly to outer ends which are contacted by the outer array of contact elements of said socket body.

13. The test socket of claim 12 wherein said transverse printed circuit board is removably attached to the top of the plunger assembly to provide a plunger unit capable of being operatively manipulated over the socket body either manually or by automated machinery.

14. The test socket of claim 13 wherein at least one air passageway extends through the plunger unit comprised of said PC board and center plunger assembly to permit vacuum pick-up of the optical DUT.

15. The test socket of claim 10 further comprising a lid structure for closing over the top of said socket body when the plunger assembly along with a contact-up optical DUT is inserted into the DUT cavity and for holding the optical DUT, the inner array of contact elements of said plunger assembly, the transverse conductor bridge, and the outer array of conductor elements of said socket body in electrical contact with each other.

16. The test socket of claim 15 wherein the transverse conductor bridge and the plunger assembly are removably mounted to the underside of said lid to form a plunger unit capable of being operatively manipulated over the socket body either manually or by automated machinery.

17. The test socket of claim 16 wherein said lid structure is detachably hinged to the socket body of the test socket for manual operation of the plunger unit comprised of the lid, transverse conductor bridge, and plunger assembly.

18. The test socket of claim 16 wherein at least one air passageway extends through the plunger unit comprised of the lid structure, transverse conductor bridge and plunger assembly to permit vacuum pick-up of the optical DUT.

19. A method of testing an IC device having a contact side and a plurality of electrical contacts on its contact, said method comprising:

orienting the IC device to be tested (DUT) in a contact-up dead bug orientation, with this orientation, placing the DUT in a device under test cavity (DUT cavity) of the socket body of a test socket which is mounted to a device under test board (DUT board), said socket body providing an outer array of conductive paths to said DUT board;

inserting a plunger assembly having a top end and a plunger end into the DUT cavity such that the plunger end of the plunger assembly contacts the contact side of the DUT, said plunger assembly providing an inner array of conductive paths which contact the plurality of electrical contacts on the contact side of the DUT upon insertion of the plunger assembly into the DUT cavity; and conductively bridging the arrays of conductive paths in said plunger assembly and socket body upon insertion of the plunger assembly into the DUT cavity whereupon an electrical path is provided through said test socket between the contacts of the contact-up DUT at the plunger end of the plunger assembly and the DUT board to which the socket body is mounted.

20. The method of claim 19 wherein the inner array of conductive paths in said plunger assembly extend to the top end of the plunger assembly and the corresponding outer array of conductive paths in said socket body extend to the top of the socket body, and wherein said inner and outer array of conductive paths are conductively bridged by a transverse conductor bridge circuit secured to the top end of said plunger assembly.

21. The method of claim 19 wherein the plunger assembly is inserted into the DUT cavity by the arm of an automated machine.

22. A method of testing an optical IC device having a photoactive side and a plurality of electrical contacts on an oppositely facing contact side, said method comprising:

orienting the optical IC device to be tested (optical DUT) in a contact-up dead bug orientation;

with this orientation, placing the optical DUT in a device under test cavity (DUT cavity) of the socket body of a test socket which is mounted to a device under test circuit board (DUT board), said socket body providing an outer array of conductive paths to said DUT board;

inserting a plunger assembly having a top end and a plunger end into the DUT cavity such that the plunger end of the plunger assembly contacts the contact side of the optical DUT, said plunger assembly providing an inner array of conductive paths which contact the plurality of electrical contacts on the contact side of the optical DUT upon insertion of the plunger assembly into the DUT cavity;

conductively bridging the arrays of conductive paths in said plunger assembly and socket body upon insertion of the plunger assembly into the DUT cavity whereupon an electrical path is provided through said test socket between the contacts of the contact-up optical DUT at the plunger end of the plunger assembly and the DUT board to which the socket body is mounted; and illuminating the photoactive side of the optical DUT from a light source positioned below the DUT board.

23. The method of claim 22 wherein the DUT cavity of said socket body is received in an opening in said DUT board and the photoactive side of the Optical DUT is illuminated through an opening in a bottom wall of said DUT cavity.

24. The method of claim 23 wherein the plunger assembly is inserted into the DUT cavity by the arm of an automated machine.

* * * * *